US010656227B2

(12) United States Patent
Gross et al.

(10) Patent No.: US 10,656,227 B2
(45) Date of Patent: May 19, 2020

(54) MAGNETIC RESONANCE EXAMINATION SYSTEM WITH FIELD PROBES

(71) Applicant: KONINKLIJKE PHILIPS N.V., Eindhoven (NL)

(72) Inventors: Patrick Gross, Eindhoven (NL); Miha Fuderer, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 158 days.

(21) Appl. No.: 15/572,202

(22) PCT Filed: May 9, 2016

(86) PCT No.: PCT/EP2016/060348
§ 371 (c)(1),
(2) Date: Nov. 7, 2017

(87) PCT Pub. No.: WO2016/180786
PCT Pub. Date: Nov. 17, 2016

(65) Prior Publication Data
US 2018/0128889 A1 May 10, 2018

(30) Foreign Application Priority Data
May 12, 2015 (EP) .................................... 15167251

(51) Int. Cl.
*G01R 33/389* (2006.01)
*G01R 33/565* (2006.01)
(52) U.S. Cl.
CPC ..... *G01R 33/389* (2013.01); *G01R 33/56518* (2013.01); *G01R 33/56563* (2013.01)
(58) Field of Classification Search
CPC .................................................. G01R 33/387

USPC .......................................... 324/319, 318, 322
See application file for complete search history.

(56) References Cited

U.S. PATENT DOCUMENTS

| 5,631,561 A * | 5/1997 | Stetter ................. G01R 33/389 324/320 |
| 5,731,704 A * | 3/1998 | Schnur ................. G01R 33/389 324/319 |
| 6,731,113 B2 | 5/2004 | Ham et al. |
| 8,854,037 B2 * | 10/2014 | Feiweier .......... G01R 33/56518 324/307 |

(Continued)

FOREIGN PATENT DOCUMENTS

| EP | 1202055 A2 | 5/2002 |
| EP | 1582886 A1 | 10/2005 |

(Continued)

OTHER PUBLICATIONS

De Zanche et al "NMR Probes for Measuring Magnetic Field and Field Dynamics in MR Systems" MRM 60 (2008) p. 176-186.

(Continued)

*Primary Examiner* — Daniel R Miller

(57) ABSTRACT

A magnetic resonance examination system is disclosed comprising a field probe system to measure the magnetic field distribution of the main magnetic field and gradient magnetic field. The measurements are made in an earlier configuration and yield the resultant magnetic field due to gradient switching or external causes. From the measured resultant magnetic field the response relation is derived and stored in the memory. The response relation from the memory is available for compensating activation of the gradient fields or correction in reconstruction for the response relation in reconstruction. This compensation or correction can be carried-out in a current configuration. Thus is the current configuration to field probes are needed.

10 Claims, 1 Drawing Sheet

(56) References Cited

U.S. PATENT DOCUMENTS

| | | | |
|---|---|---|---|
| 2004/0032260 A1 | 2/2004 | Fontius et al. | |
| 2013/0241553 A1 | 9/2013 | Van Den Brink et al. | |
| 2013/0271126 A1 | 10/2013 | Griswold et al. | |
| 2014/0327438 A1 | 11/2014 | Barmet et al. | |
| 2019/0025397 A1* | 1/2019 | Harris | G01R 33/56518 |

FOREIGN PATENT DOCUMENTS

| | | |
|---|---|---|
| EP | 2515132 A1 | 10/2012 |
| EP | 2610632 A1 | 7/2013 |
| WO | 2014189205 A1 | 11/2014 |

OTHER PUBLICATIONS

Vannesjo et al "Gradient System Characterization by Impuse Response Measurements With a Dynamic Field Camera" Magnetic Reson. in Med., vol. 69, No. 2, Apr. 12, 2012.

Barmet et al "A Third-Order Field Camera With Microsecond Resolution for MR System Diagnostics" Proceedings of the International Soc. for Mag. Reson. in Med. Apr. 2009, p. 781.

Graedel et al "Image Reconstruction Using the Gradient Impose Response for Trajectory Prediction" Proc. of the International Soc. for Magnetic Res. in Med, Apr. 2013, p. 552.

Chan et al "Characerization and Correction of Eddy-Current Artifacts in Unipolar and Bipolar Diffusion Sequences Using Magnetic Field Monitoring" Journal of Mag. Reson. vol. 244, May 14, 2014 p. 74-84.

Busch et al "Analysis of Temperature Dependence of Background Phase Errors in Phase-Contrast Cardiovascular Magnetic Reosnance" Journal of Cardiovascular Magnetic Resonance, vol. 16, No. 1 Dec. 11, 2014 p. 97.

Barmet et al "Concurrent Higher-Order Field Monitoring for Routine Head MRI: An Integrated Heteronuclear Setup" Proc. of the Int. Soc. for Magnetic Reson. in Med. Apr. 15, 2010, p. 216.

Barmet et al "Spatiotemporal Magnetic Field Monitoring for MR" Magnetic Resonance in Med. vol. 60, (2008) p. 187-197.

\* cited by examiner

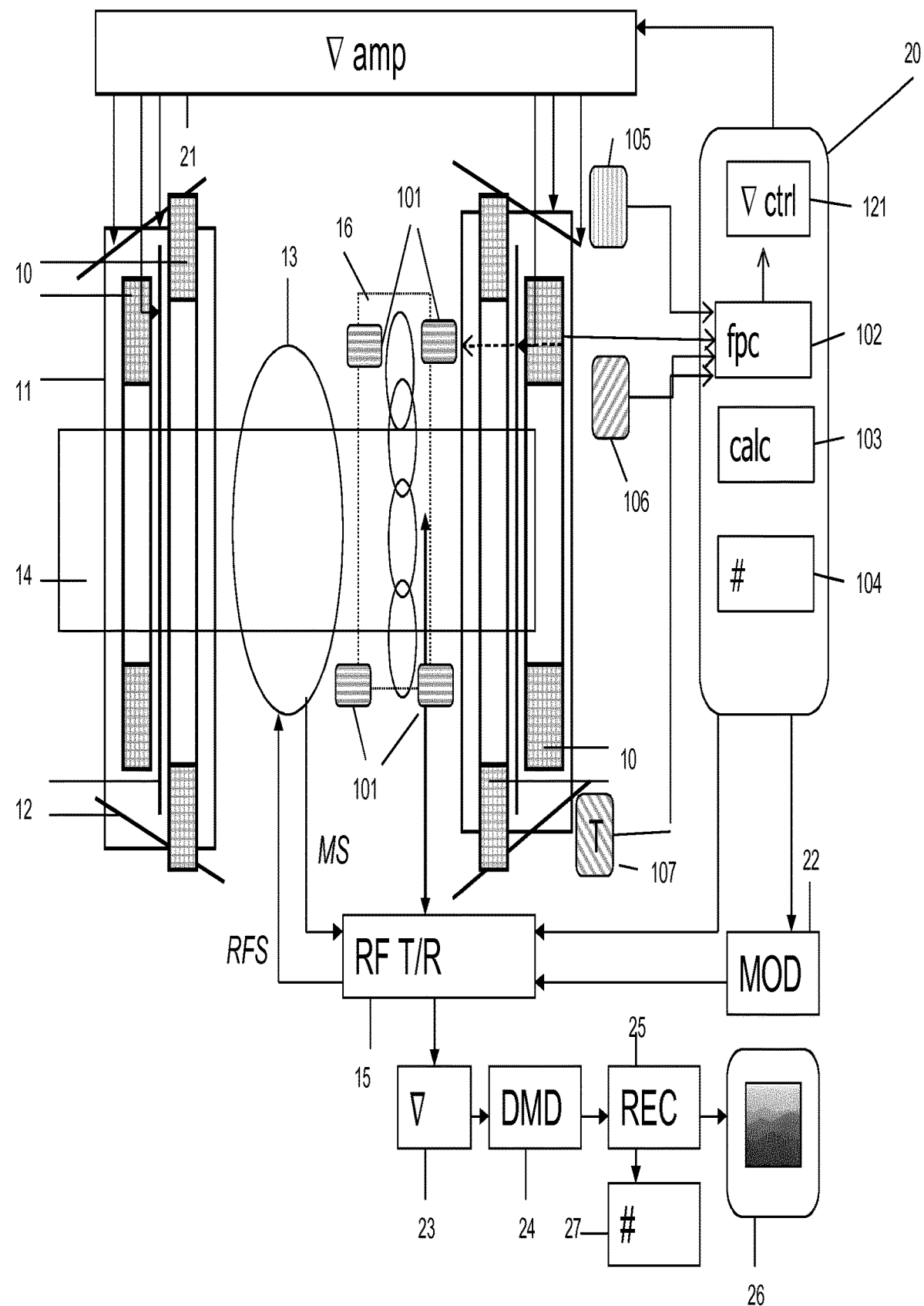

MAGNETIC RESONANCE EXAMINATION SYSTEM WITH FIELD PROBES

CROSS REFERENCE TO RELATED APPLICATIONS

This application is a U.S. national phase application of International Application No. PCT/EP2016/060348, filed on May 9, 2016, which claims the benefit of EP Application Serial No. 15167251.6 filed on May 12, 2015 and is incorporated herein by reference.

FIELD OF THE INVENTION

Magnetic resonance imaging (MRI) methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MRI method in general, the body of the patient to be examined is arranged in a strong, uniform magnetic field $B_0$ whose direction at the same time defines an axis (normally the z-axis) of the co-ordinate system to which the measurement is related. The magnetic field $B_0$ causes different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field $B_1$ of this RF pulse extends perpendicular to the z-axis, so that the magnetization performs a precession motion about the z-axis. The precession motion describes a surface of a cone whose angle of aperture is referred to as flip angle. The magnitude of the flip angle is dependent on the strength and the duration of the applied electromagnetic pulse. In the example of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z-direction relaxes with a second and shorter time constant $T_2$ (spin-spin or transverse relaxation time). The transverse magnetization and its variation can be detected by means of receiving RF antennae (coil arrays) which are arranged and oriented within an examination volume of the magnetic resonance examination system in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution in the subject being imaged, such as a patient to be examined, constant magnetic field gradients extending along the three main axes are superposed on the uniform magnetic field $B_0$, leading to a linear spatial dependency of the spin resonance frequency. The signal picked up in the receiving antennae (coil arrays) then contains components of different frequencies which can be associated with different locations in the body. The signal data obtained via the receiving coils correspond to the spatial frequency domain of the wave-vectors of the magnetic resonance imaging signals and are called k-space data. The k-space data usually include multiple lines acquired of different phase encoding. Each line is digitized by collecting a number of samples. A set of k-space data is converted to an MR image by means of Fourier transformation.

The transverse magnetization dephases also in presence of constant magnetic field gradients. This process can be reversed, similar to the formation of RF induced (spin) echoes, by appropriate gradient reversal forming a so-called gradient echo. However, in case of a gradient echo, effects of main field inhomogeneities, chemical shift and other off-resonances effects are not refocused, in contrast to the RF refocused (spin) echo.

BACKGROUND OF THE INVENTION

The present invention pertains to an magnetic resonance examination system comprising a field probe system with field probes.

Such a magnetic resonance examination system is known from the European patent application EP 1 582 886.

The known magnetic resonance examination system comprises a main magnet to generate a stationary magnetic field. Magnetic resonance signals are acquired from an object to be examined. To that end, gradient magnetic fields and radiofrequency fields are generated according to an MR sequence. Further, additional data are acquired from field probes positioned in the vicinity of the object. The additional data represent variations of the magnetic field distribution due to gradient switching. These variations as a function of gradient switching are characterised by the so-called gradient impulse response function (GIRF) which constitutes a response relation between the gradient switching and the ensuing magnetic field variations. These additional data are used for adjusting the MR sequence to correct for imperfections in the field distribution. The additional data are also used with the acquired magnetic resonance signal for reconstruction of the magnetic resonance images.

SUMMARY OF THE INVENTION

An object of the invention is to provide a field probe system for a magnetic resonance examination system that is more accurate or subject to less restrictions, compared to the known probe system, as to the configuration of the magnetic resonance examination system and the position of the patient to be examined in the examination zone. Notably, an object of the invention is to provide a field probe system that is less subject to available space to accommodate the field probes.

This object is achieved by the magnetic resonance examination system having an examination zone and comprising
 a main magnet to generate a stationary main magnetic field in the examination zone and
 a gradient system with one or more gradient coils to generate a gradient magnetic field in the examination zone
 a reconstruction module configured to
  access magnetic resonance imaging signals from the examination zone at a current configuration and
  reconstruct an magnetic resonance image from the magnetic resonance imaging signals
 a field probe system including
  several field probes to measure a magnetic field distribution in the examination zone and the field probe system being configured to determine the measured magnetic field distribution in the examination zone (i) in relation to a switching operation of the gradient system and/or (ii) in relation to a magnetic field disturbance originating externally, a control module
to control the field probe system and configured to activate the field probe system to measure the magnetic field distribution in an earlier configuration and
to determine, in the earlier configuration, i) a response relation between the switching operation of the gradient fields and the magnetic field distribution in the examination zone, and ii) a response relation between the magnetic field disturbance originating externally and the magnetic field distribution in the examination zone.

a memory to store the response relation in association with i) said switching operation of the gradient system and/or with (ii) said magnetic field disturbance originating externally, (a) the gradient system to apply the response relation from the memory with switching operation of the gradient fields and/or magnetic field disturbance originating externally in the current configuration to the gradient system so as to compensate activation the gradient coils in a current configuration and/or (b) the reconstruction module to access the response relation from the memory with the gradient fields' switching operation and/or magnetic field disturbance originating externally in the current configuration and reconstruction module being configured to apply corrections on the basis the response relation in the reconstruction of the magnetic resonance image from the magnetic resonance imaging signals acquired in the current configuration.

An insight of the present invention is that in the known magnetic resonance examination system the field probe system can only function properly when there is sufficient space in the examination zone for both the (part of) the object to be examined, e.g. a patient as well as for the field probes. An insight of the present invention is further that a drawback of the known correction by the additional data e.g. via the GIRF, from the field probes is that either the additional data may be outdated or that the additional data are acquired more often in separate calibrations which is time consuming. It is also known per se to incorporate field probes in a head coil, so that the additional data may be acquired while the patient is positioned in the head coil; that approach appears be applicable only in imaging of the patient's head. According to the invention, however, on the one hand the measurement of the magnetic field distributions of the stationary magnetic field and of the gradient magnetic field and on the other hand the acquisition of the magnetic resonance imaging signals from the patient to be examined are separated.

Both the current and previous configurations are arranged to acquire magnetic resonance imaging signals from a patient to be examined. That is, in both previous and current configurations high-spatial resolution MR image data (as represented by the magnetic resonance imaging signals) may be acquired. From these, MR-image data (of a patient to be examined) may be reconstructed. These MR-image data have clinical relevance in that a diagostic quality magnetic resonance image can be reconstructed from the MR image data. The MR-image data may be acquired simultaneously and in the same or parallel data stream(s) with the acquisition of data by the field probes. The switching operation of the gradient fields and/or magnetic field disturbance originating externally in the current configuration may be available from the way the gradient system is operated in the current configuration and by measurement of the magnetic fields originating externally in the current configuration. In the framework of the invention this simultaneous measurement acquisition encompasses that the measurements by the field probe are done in a time span that at least partly overlaps with the time span in which magnetic resonance image signals are acquired This simultaneous acquisition may or may not be mutually synchronised in that the measurements intervals coincided in time. Further, the actual intake of data bits of the respective data streams may or may not be mutually offset or alternating on the level of individual (groups of) bits as long as the measurement intervals that span the measurement by the probes and acquisition of magnetic resonance imaging signals overlap in time to some extent. The measurement of the magnetic field distribution by the field probes and the determination of the response relation in the earlier configuration may be more often repeated than the known separate calibration of the GIRF. As the probes may measure the magnetic field distribution and the response relation may be determined from these measurements during the acquisition of clinically relevant MR image data, updating the response relation can be done in a time efficient manner.

The magnetic field distribution represents the spatial variations in the examination zone of the main stationary magnetic field and of the gradient magnetic fields that are temporarily applied for selecting spins to be manipulated by radiofrequency pulses and for spatially encoding of the magnetic resonance imaging signals. The gradient system executes switching operations in that electrical currents supplied by a gradient amplifier to the one or several gradient coils are switched so that the temporary gradient magnetic fields are changed. Notably, the gradient amplifier is controlled by applying a gradient waveform representing the desired temporary gradient magnetic fields in the form of gradient pulses. Changes in the applied gradient waveform cause the temporary gradient magnetic field to change. Due to gradient switching and external causes such as external magnetic field disturbances or mechanical vibrations, a resultant magnetic field arises. This resultant magnetic field is a temporal and spatial variation of the magnetic field distribution that ensues from the gradient switching or external causes. It appears that the resultant magnetic field occurs of the main magnetic field as well as of the gradient magnetic field due to switching of the gradient system or from external causes. This resultant magnetic field is in the form a transient field-settling of the main magnetic field and gradient magnetic fields. Notably, this transient field settling includes concomitant electromagnetic fields and electromagnetic fields caused by eddy-currents that are generated by the switching of the gradient system.

The response relation represents the relationship between (a) gradient switching operations and/or magnetic field disturbances originating externally and (b) the resultant magnetic field distributions. The response relation thus may also be termed a field response as the response relation represents how the magnetic (gradient) fields respond to gradient switching operations and magnetic field disturbances originating externally. An insight of the invention may be that the response relation as determined in the earlier configuration is also valid in the current configuration in which the resultant magnetic field distribution can be determined from the response relation and the gradient switching operations and or the magnetic field disturbances originating externally in the current configuration. Because in this way the resultant magnetic field distribution is available in the current configuration, disturbances may be compensated or corrected for.

The resultant magnetic field distribution, may be stored in a data-compressed version in the memory. Thus, a database may be constructed of data-compressed versions of the resultant magnetic field distributions which may be stored in relation to switching operations of the gradient fields and/or magnetic field disturbances originating externally in the earlier configuration. This database forms an implementation of the response relation between gradient-switching and magnetic field disturbances originating externally and their resultant magnetic field distributions. The response relation may also be represented as a correlation between the gradient switching or external cause and the ensuing resulting magnetic field. Other ways to form the response relation are the impulse response function, step response function or modulation transfer function of the resultant magnetic field that ensues from the gradient switching or said external causes. The response relation may also be formed as a parameterised function of time. The function represents the time evolution of the resultant magnetic field and its parameters are for example the gradient switching or the external course to which the resultant magnetic field is due.

Restrictions caused by the presence in the examination zone of the patient to be examined no longer apply to positioning the field probes in the examination zone, and vice versa. The spatial field distributions of the stationary and gradient magnetic fields, are measured by the field probes in an earlier configuration in which the field probes are positioned at suitable, preferably optimal locations for measuring the magnetic field distributions in the examination zone. Notably, in practice the field probe system includes a number of 4, or preferably 8 to 32 field probes. The field probes are preferably positioned at about 10-15 cm from the magnet's iso-centre. At closer distance to the iso-centre, the probes are rather insensitive to spatially higher order variations of the magnetic field distribution. At larger distance from the iso-centre, measurement of the spatial distribution of the magnetic field is dominated by higher order spatial variations. This makes an estimate of the lower order spatial variations unreliable. Moreover, at larger distances from the iso-centre, interferences between the RF transmit antenna (e.g. the RF body coil) and the field probes become stronger. These interferences make the measurements by the field probe unreliable. The present invention enables to measure the magnetic field distribution in the earlier configuration in which the field probes are properly, preferably optimally, positioned to accurate measure the magnetic field distribution. In the current configuration the field probes are not needed. The resulting magnetic field required in the current configuration is accessed by a close approximation, measured from the earlier configuration and available from the memory. The earlier configuration in which the magnetic field distribution is measured may be a configuration in which the same or a different object is imaged, or no object at all is imaged, and the field probes are positioned and employed to measure the magnetic field distribution.

The magnetic field distribution measured in the earlier configuration and represented by its response relation with gradient switching or magnetic fields originating externally, appears to be useful to be employed as an estimate or fair approximation of the magnetic field distribution in the current configuration. In particular, the earlier configuration represents the geometric arrangements of the field probes for measuring the magnetic field distribution in the examination zone as well as the geometric arrangement of one or more objects, if any, in or around the examination zone and the electromagnetic properties, such as the magnetic susceptibility distribution of these objects. These resultant magnetic fields due to gradient switching or external disturbances are independent from field distortions due to magnetic susceptibility of an object, patient or test-phantom. Such an object in the earlier configuration may be a body part of a patient to be examined or healthy volunteer or the test-phantom of a predetermined material composition. The body part in the earlier configuration may be a body part of the same patient to be examined in the current configuration or may be a body part of an other individual. The body part in the earlier configuration and in the current configuration may be different body parts of the same patient to be examined. Hence, only in the earlier configuration, there needs to be sufficient space to accommodate the field probes and in the current configuration there may be no space available to place any field probes. It appears quite practical to use an MR imaging configuration with a patient's head in a (e.g. birdcage, or antenna-array) head-coil as the earlier configuration. Then, in the current configuration formed by the patient's abdomen and a local RF coil array, the magnetic field from distribution from the earlier configuration appears quite useful to compensate gradient field or to apply correction in reconstruction in the current configuration.

The resultant magnetic field due to gradient switching occurs typically at a time scale of 1-1000 µs, typically 300 µs. The field probe system is able to measure the magnetic field distribution due to gradient switching at a temporal resolution of 1-10 µs. In order to measure the magnetic field effects to gradient-switching, then a sampling resolution of 1-100 µs, preferable 3-30 µs is useful. In order to measure magnetic field-disturbances by moving objects and power-lines, a temporal resolution of 1 ms is sufficient. The field probe system is able to measure variations of magnetic field strength of 1-10 µT or gradient strengths of 1-2000 µm. A field probe system having such capabilities is known per se from the paper '*NMR probes for measuring magnetic field and field dynamics in MR systems*' by N. De Zanche et al. in MRM60(2008)176-186.

The measured magnetic field distribution or preferably its response relation may be employed to account for the current resultant magnetic field. That is, the resultant magnetic field associated with the earlier measured magnetic field distribution is an adequate approximation of the resultant magnetic field of the current configuration. It appears that the measured magnetic field distribution in the reference configuration often is a close representation of the resultant magnetic field in the current configuration. Further, the earlier measured magnetic field distribution can, by way of its response relation, be employed to adapt transmit frequencies and demodulation frequencies to account for the resultant magnetic field in the current configuration. In reconstruction of the magnetic resonance image the earlier measured magnetic field distribution, or preferably the response relation, can be used to correct for errors due to the current resultant magnetic field. Alternatively, the earlier measured magnetic field distribution, notably its response relation, may be employed to control the gradient system to compensate for the resultant magnetic field formed by transient effects due to gradient switching. This is achieved by activating the gradient coils, i.e. applying electrical currents to the gradient coils, on the basis of the earlier measured field distribution. In other words, the electrical currents to the gradient coils are adjusted while accounting for the earlier measured magnetic field distribution, or the response relation that represents it, so as to compensate for the resultant magnetic fields in the current configuration in the form of the transient effects of notably concomitant electromagnetic fields and eddy current responses due to the gradient switching in the examination zone.

The field probe system in the magnetic resonance examination system of the invention is able to provide data to account for the resultant main magnetic field and gradient magnetic field in situations even if there is no sufficient space in the examination zone for both the part of the body of the patient to be examined as well as the field probes. This is based on the insight that the responses of the field distributions due to gradient switching or other causes are well reproducible. Accordingly, the magnetic field distribution measured in the earlier configuration in dependence of switching the gradient system can be employed to compensate the application of the gradient magnetic field for the resultant magnetic field in the current configuration. Also, the magnetic field distributions measured in the earlier configuration or the response relation representing the resultant magnetic field, in dependence of switching the gradient system can be employed to correct for the resultant magnetic fields in reconstruction.

A magnetic resonance examination system is disclosed comprising a field probe system to measure the magnetic field distribution of the main magnetic field and gradient magnetic field. The measurements are made in an earlier configuration and yield the resultant magnetic field due to gradient switching or external causes. From the measured resultant magnetic field the response relation is derived and stored in the memory. The response relation from the memory is available for compensating activation of the gradient fields or correction in reconstruction for the response relation in reconstruction. This compensation or correction can be carried-out in the current configuration. Thus in the current configuration to field probes are needed.

These and other aspects of the invention will be further elaborated with reference to the embodiments defined in the dependent Claims.

In a preferred embodiment of the magnetic resonance examination system of the invention the field probe system is configured to successively measure the magnetic field distribution in various earlier configurations as a function of (i) the switching operation of the gradient system and/or (ii) the magnetic field disturbance originating externally. Measurements of the magnetic field distribution from several successive different earlier configurations may be employed to build-up an accurate representation of the resultant magnetic field depending on various gradient switching and/or originating from externally from the magnetic resonance examination system, magnetic field disturbances. This may be implemented in that each time the field probe system is activated, the response relation is stored for that earlier configuration. The field probe system may be configured to automatically measure the magnetic field distribution. Alternatively, the field probe system may be prompted to activate measurement of the magnetic field distribution in the earlier configuration. This may be done e.g. when the content of the memory is outdated, in that the latest entry was made earlier than a pre-set time span before the current date. The measurements of the magnetic field distribution by the field probes may be made in the earlier configurations during or simultaneously with acquisition of MR imaging data. These examples of the field probe system have self-learning capability in that from the measurements of the magnetic field distribution in the earlier configurations a collection of response relations is built-up which can be used to account for resultant magnetic fields in the current configuration. Further, because in the current configuration, the response relation is available from the memory, the field probes are not needed in the current configuration.

In another example of the magnetic resonance examination system of the invention the field probe system is configured to determine a correlation between the measured magnetic field distribution from the probes and (i) the switching operation of the gradient system, and/or (ii) a magnetic field disturbance originating externally and store the determined correlation as the representation of said measured magnetic field distribution. As only the correlation of the gradient switching operation or the external magnetic field disturbance needs to be stored as the representation of the resultant magnetic field, a modest memory capacity is required. This representation can be implemented as the impulse response function. The impulse response function can be computed from the measured magnetic field distribution and the applied gradient switching or a detected external disturbance. In one very simple example the correlation or the response relationship is formed as a simple scale factor. That is, e.g. the actual resulatant magnetic field simply scales with the gradient switching demand or with the external magnetic field disturbance. For example, in the earlier configuration a gradient field of 10.2 mT/m is measured in response to an applied gradient demand of 10.0 mT/m, then the scale factor is 1.02 which can be employed in the current configuration the compensate in the applied gradient demand or to correct for in reconstruction. In a more intricate situation, the may be a linear relationship between the resulatant magnetic fields and external causes, such as magnetic field distrurbances originating externally that may be represented by a matrix.

Usually, the measurement of the magnetic field distribution in the earlier configuration is at an earlier instant in time than the acquisition of magnetic resonance imaging signals in the current configuration. However, the measurement of the magnetic field distribution may be done even after the acquisition of the magnetic resonance imaging signals and the response relation may be employed to correct for in reconstruction of the magnetic resonance image from the magnetic resonance imaging signals.

In a further example of the magnetic resonance examination system of the invention one or more additional magnetic field sensors are provided to measure the external field disturbances. Then on the basis of the measured external field disturbances, the field resultant field is retrieved from the memory that corresponds with the measured magnetic field disturbance in the current configuration.

These magnetic field sensors detect magnetic field disturbances to which the main magnetic field and the gradient magnetic fields may respond. For example, such magnetic field disturbances may be caused by external causes such as passing vehicles or electrical power lines. Internal causes, such as the magnetic resonance examination system's cryostatic cooling system, additional electrical equipment such as fans, may as well cause magnetic field disturbances. The magnetic field distribution in the examination zone is measured by the field probe system in dependence of the detected magnetic field disturbances. It appears that the resultant magnetic field strongly and reproducibly correlates with the detected magnetic field disturbances. Thus, the earlier measured resultant magnetic field are generated in dependence of the detected magnetic field disturbance and the response relation that represent it is derived, notably in the earlier configuration. When, subsequently, in a current configuration a magnetic field distribution is detected, the application of the gradient magnetic field and/or the reconstruction of the magnetic resonance image can be corrected for the response of the magnetic field distribution, e.g. using the response relation associated with it, that was measured earlier in the corresponding earlier configuration for the detected magnetic field disturbance.

In another example, the magnetic resonance examination system of the invention is provided with motion sensors, notably to detect vibrations of the structural components, notably the gradient coils and main magnetic field coils. It appears that such vibrations generate a resultant magnetic field distribution. The field probe system is arranged to measure the magnetic field distribution and its associated response relation is derived in the earlier configuration in dependence of the detected vibrations. Subsequently, when in the current configuration a vibration is detected, then the application of the gradient magnetic field and/or the reconstruction of the magnetic resonance image can be corrected for the resultant magnetic field distribution, e.g. using the response relation associated with it, for the detected vibration that was measured earlier in the earlier configuration.

In another example, the magnetic resonance examination system of the invention is provided with temperature sensors, notably to detect the structural components' temperature, notably of the gradient coils and main magnetic field coils. It appears that such resultant magnetic field distributions due to gradient switching are temperature dependent. The field probe system is arranged to measure the magnetic field distribution in the earlier configuration in dependence of the measured temperature. The field probe system derives the response relation in dependence of the measured temperature. Subsequently, when in the current configuration the temperature of e.g. the gradient coil, is detected, then the application of the gradient magnetic field and/or the reconstruction of the magnetic resonance image can be corrected for the resultant magnetic field for the measured temperature. In other words, the earlier measured magnetic field distribution is measured in dependence of the measured temperature in the earlier configuration. In the current configuration, the response relation is retrieved from the measured temperature in the current configuration. Thus, temperature dependencies of the response relation are adequately taken into account.

The invention also relates to a magnetic resonance imaging method as defined in claims 7 and 8. This magnetic resonance imaging method of the invention achieves to make response relations available in without the need for field probes in the current configuration. The invention further relates to a computer programme as defined in claim 9. The computer programme of the invention can be provided on a data carrier such as a CD-rom disk or a USB memory stick, or the computer programme of the invention can be downloaded from a data network such as the world-wide web. When installed in the computer included in a magnetic resonance imaging system the magnetic resonance imaging system is enabled to operate according to the invention and achieves to make information on or a representation of response relations available in without the need for field probes in the current configuration.

A separate reference configuration may also be employed as the earlier configuration in which the field probes are optimally positioned to measure the magnetic field distribution. In such reference configuration a test-phantom may be used of which the magnetic resonance properties (material composition, e.g. proton density and magnetisation decay times) are pre-determined. Alternatively, in the reference configuration the examination zone may be left empty, apart from the field probes and possibly the RF receiver coil in which the field probes are mounted.

For example, in the earlier configuration the test-phantom may be placed in the examination zone, or no object to be imaged is placed in the examination zone, and in the current configuration a part of the patient to be examined is located in the examination zone. In another example, in the earlier configuration a reference part of the patient's body is placed in the examination zone, in the earlier configuration a currently examined (different) part of the patient's body is placed in the examination zone, or the examination zone is left empty apart from the field probes. Even in the earlier and current configurations respectively, body parts of different patients being imaged may be used. Notably, the phantom or the reference part are dimensioned such that when placed in the examination zone, there is sufficient space left to position the field probes in proper positions in the examination zone. Thus, accurate measurement, notably of the lower order spatial variations, of the magnetic field in the examination zone is achieved. When imaging the current body part, there is no need for the field probes since the current resultant magnetic field is calculated from the stored response relation from the earlier measured magnetic field distribution. Thus, for imaging of the current body part, the field probes may be removed. In a typical example, the earlier measured magnetic field distribution may be measured with the patient's head placed in the examination zone and the field probes arranged around the patient's head. For example, the field probes may be integrated in an RF transmit/receive head-coil (array, TEM or bird-cage type) that is employed to acquire the magnetic resonance imaging signals from the patient's head. Then in the current configuration the patient's abdomen or thorax is placed in the examination zone and the field probes removed. As the patient's abdomen or thorax may take up most of the space of the examination zone, or even only fits tightly in the main magnet's bore of the magnetic resonance examination system, there may be no space left to arrange the field probes. An insight of the present invention is that the magnetic field distribution measured from the patient's head (i.e. in the earlier configuration) will still be valid to correct for resultant magnetic fields of the stationary main magnetic field and of the gradient magnetic field when acquiring magnetic resonance imaging signals from the patient's abdomen or thorax (i.e. in the current configuration). Notably the main magnetic field and/or the gradient magnetic field, or the response relations representing the resulting magnetic fields, (i) as measured while the patient's head is imaged and (ii) as apply when the patient's abdomen is imaged are at most marginally different.

These and other aspects of the invention will be elucidated with reference to the embodiments described hereinafter and with reference to the accompanying drawing wherein

BRIEF DESCRIPTION OF THE DRAWINGS

The FIGURE shows diagrammatically a magnetic resonance imaging system in which the invention is used.

DETAILED DESCRIPTION OF THE EMBODIMENTS

The FIGURE shows diagrammatically a magnetic resonance imaging system in which the invention is used. The magnetic resonance imaging system includes a main magnet with a set of main coils 10 whereby the steady, uniform magnetic field is generated. The main coils are constructed, for example in such a manner that they from a bore to enclose a tunnel-shaped examination space. The patient to be examined is placed on a patient carrier which is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a gradient control 21 which includes one or more gradient amplifier and a controllable power supply unit. The gradient coils 11, 12 are energised by application of an electric current by means of the power supply unit 21; to this end the power supply unit is fitted with electronic gradient amplification circuit that applies the electric current to the gradient coils so as to generate gradient pulses (also termed 'gradient waveforms') of appropriate temporal shape. The strength, direction and duration of the gradients are controlled by control of the power supply unit. The magnetic resonance imaging system also includes transmission and receiving antennae (coils or coil arrays) 13, 16 for generating the RF excitation pulses and for picking up the magnetic resonance imaging signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is generally used alternately as the transmission coil and the receiving coil. Typically, a receiving coil includes a multiplicity of elements, each typically forming a single loop. Various geometries of the shape of the loop and the arrangement of various elements are possible The transmission and receiving coil 13 is connected to an electronic transmission and receiving circuit 15. It is to be noted that is that there is one (or a few) RF antenna elements that can act as transmit and receive; additionally, typically, the user may choose to employ an application-specific receive antenna that typically is formed as an array of receive-elements. For example, surface coil arrays 16 can be used as receiving and/or transmission coils. Such surface coil arrays have a high sensitivity in a comparatively small volume. The receiving coil is connected to a preamplifier 23. The preamplifier 23 amplifies the RF resonance signal (MS) received by the receiving coil 16 and the amplified RF resonance signal is applied to a demodulator 24. The receiving antennae, such as the surface coil arrays, are connected to a demodulator 24 and the received pre-amplified magnetic resonance imaging signals (MS) are demodulated by means of the demodulator 24. The pre-amplifier 23 and demodulator 24 may be digitally implemented and integrated in the surface coil array The demodulated magnetic resonance imaging signals (DMS) are applied to a reconstruction unit. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. In particular the surface receive coil arrays 16 are coupled to the transmission and receive circuit by way of a wireless link. Magnetic resonance imaging signal data received by the surface coil arrays 16 are transmitted to the transmission and receiving circuit 15 and control signals (e.g. to tune and detune the surface coils) are sent to the surface coils over the wireless link.

The reconstruction unit derives one or more image signals from the demodulated magnetic resonance imaging signals (DMS), which image signals represent the image information of the imaged part of the object to be examined. The reconstruction unit 25 in practice is constructed preferably as a digital image processing unit 25 which is programmed so as to derive from the demodulated magnetic resonance imaging signals the image signals which represent the image information of the part of the object to be imaged. The signal on the output of the reconstruction is applied to a monitor 26, so that the reconstructed magnetic resonance image can be displayed on the monitor. It is alternatively possible to store the signal from the reconstruction unit 25 in a buffer unit 27 while awaiting further processing or display.

The magnetic resonance imaging system according to the invention is also provided with a control unit 20, for example in the form of a computer which includes a (micro) processor. The control unit 20 controls the execution of the RF excitations and the application of the temporary gradient fields. To this end, the computer program according to the invention is loaded, for example, into the control unit 20 and the reconstruction unit 25.

The magnetic resonance examination system of the invention is provided with several (e.g. 4, 8 or 32) field probes 101, which are preferably mounted in the head coil 16. The field probes measure the magnetic field distribution due to gradient switching and/or due to external magnetic field disturbances. The field probes 101 are connected to the field probe control module 102. The field probe control module controls the field probes to carry-out the measurements of the magnetic field distribution when the head-coil 16 is in position in the earlier configuration. The measurement results are provided to the field probe control module 102 to determine the magnetic field distribution due to the gradient switching or external magnetic field disturbance. In this earlier configuration no object, other than the head coil 16 with the field probes is positioned in the examination zone of the magnetic resonance examination system. In another implementation the magnetic field distribution may be measured while the head of the patient to be examined is imaged. From the measured magnetic field distribution, the response relation, e.g. in the form of the impulse response function, is computed by an arithmetic unit 103 and then saved in the memory 104. The field probes 101, the field probe control 101 with the arithmetic unit 102 and the memory 104 make up the field probe system. The field probe control 101 with the arithmetic unit 102 and the memory 104 may be integrated, notably as software modules, in the magnetic resonance examination system's processing unit 20. Also the gradient control 121 is integrated in the processing unit 20. The gradient control 121 generates the gradient waveforms that are fed to the power amplifier 20 to activate the gradient coils 12 in accordance with the gradient waveforms.

The saved representation of the response relation, notably the impulse response function, can be employed to control the gradient control 121 to compensate for the response relation in activation of the gradient coils 12. The saved representation of the response relation may also be employed to correct for the response field in the reconstruction of the magnetic resonance image from the acquired magnetic resonance imaging signals. Because the representation of the response relation is available from the memory 104, in the current configuration there is no need for the measurements by the field probes of the response field. Thus in the current configuration the head coil 16 with the field probes may be removed and e.g. replaced by a local anterior coil array 16 to acquire magnetic resonance imaging signals from the patient's abdominal region. In the current configuration, magnetic resonance imaging signals may also be acquired by the RF body coil 13.

The magnetic resonance examination system is further provided with one or several magnetic field sensors 105 to measure magnetic field disturbances. Such magnetic field disturbances may have an external cause, such as a passing vehicle, or due to activity of nearby electrical power lines. Other magnetic field disturbances may be caused by the magnetic resonance examination system cryostat system (not shown). The magnetic field disturbances are provided measured by the field probes 101 in the head coil 16 (that is in the earlier configuration). On the basis of detected magnetic field disturbance in the current configuration (where the field probes are not available) the response relation, e.g. impulse response function, of the resultant magnetic field due to the magnetic disturbance, is available from the memory. The gradient control 121 may compensate for the response field on the basis of the representation available from the memory 104. Further, the representation may be employed to account for the resultant magnetic field in the reconstruction by the reconstruction unit 25.

The magnetic resonance examination system is also provided with one or several motion sensors 106, notably to measure motion, e.g. vibrations of the gradient coils 12. The detected vibrations are fed to the field probe control unit and the ensuing magnetic field distribution is measured in the earlier configuration with the field probes 101 in the head coil 16. In the current configuration, i.e. without the field probes available, the vibrations are also measured and on the basis of these measurements and the response relation is available from the memory 104. The available response relation is then used to compensate the activation of the gradient coil 12 for the resultant magnetic fields due to the detected vibrations. Correction for the resultant magnetic field due to the detected vibration may also be carried-out in the reconstruction in the reconstruction unit 25.

The magnetic resonance examination system is further fitted with one or several temperature sensors 105 to measure the temperature of the gradient coil 12. The measured temperature of the gradient coils 12 is fed to the field probe control module 102 in both the earlier configuration in which the magnetic field distribution is measured by the field probes 101 in the head coil 16 and in the current configuration (without the head coil with the field probes). Using the measured temperatures of the gradient coils allows to take temperature dependence of the response relation into account for compensation by the gradient control or for correction in reconstruction.

The invention claimed is:

1. A magnetic resonance examination system having an examination zone and comprising:
   a main magnet to generate a stationary main magnetic field in the examination zone and
   a gradient system with one or more gradient coils to generate a gradient magnetic field in the examination zone,
   a reconstruction module configured to access respective sets of magnetic resonance imaging signals from the examination zone at a current configuration and at an earlier configuration
   reconstruct an magnetic resonance images from the sets of magnetic resonance imaging signals acquired at the earlier and current configurations
   a field probe system including
      a plurality of field probes to measure a magnetic field distribution in the examination zone (i) due to a switching operation of the gradient system and/or (ii) due to a magnetic field disturbance originating externally,
      a control module
         to control the field probe system and configured to activate the field probe system to measure the magnetic field distribution in an earlier configuration simultaneously with the acquisition of the magnetic imaging resonance signals in the earlier configuration and
         to determine a response relation representing the measured magnetic field distribution in the earlier configuration and i) due to said switching operation of the gradient system and/or (ii) due to said magnetic field disturbance originating externally,
      a memory to store the response relation in association with i) said switching operation of the gradient system and/or with (ii) said magnetic field disturbance originating externally,
   (a) the gradient system to apply the response relation from the memory to the gradient system so as to compensate activation the gradient coils in a current configuration and/or
   (b) the reconstruction module to apply the response relation from the memory to the reconstruction module which is configured to apply corrections on the basis the response relation in the reconstruction of the magnetic resonance image from the magnetic resonance imaging signals acquired in the current configuration.

2. The magnetic resonance examination system of claim 1, wherein the field probe system is configured to
   successively measure the magnetic field distribution in various earlier configurations as a function of (i) the switching operation of the gradient system and/or (ii) the magnetic field disturbance originating externally,
   determine response relations representing the measured magnetic field distributions for the various earlier configurations,
   store the determined response relations in dependence of (i) said switching operations and/or (ii) said magnetic field disturbances in the memory.

3. The magnetic resonance examination system of claim 1, wherein the field probe system is configured to determine the response relation in the form of
   (a) a correlation between the measured magnetic field distribution and (i) the switching operation of the gradient system, and/or (ii) a magnetic field disturbance originating externally, or
   (b) an impulse response function of the measured magnetic field distribution due to (i) said switching operation of the gradient system, and/or (ii) said magnetic field disturbance, or
   (c) a step response function of the measured magnetic field distribution due to (i) said switching operation of the gradient system, and/or (ii) said magnetic field disturbance, or (d) a modulation transfer function of the measured magnetic field distribution due to (i) said switching operation of the gradient system, and/or (ii) said magnetic field disturbance.

4. The magnetic resonance examination system of claim 1, further comprising
one or more additional magnetic field sensors to measure external magnetic field disturbances in the current configuration, wherein
the control module is configured to activate the field probe system to retrieve from the memory the response relation that corresponds with the measured external field distribution in the current configuration.

5. The magnetic resonance examination system of claim 1, further comprising:
one or more motion sensors to measure mechanical movements of one or more structural components of the magnetic resonance examination system, wherein
the control module of the field probe system is configured to control the field probe system to measure the magnetic field distribution in the earlier configuration of the main magnetic field and/or the gradient magnetic field due to a magnetic field disturbance originating externally in dependence of the measured mechanical movement and in the memory store the response relation associated with the measured mechanical movements in the earlier configuration and wherein
the control module of the field probe system is configured to retrieve from the memory the response relation that corresponds with the measured mechanical movement in the current configuration.

6. The magnetic resonance examination system of claim 1, further comprising:
one or more temperature sensors to measure the temperature of a structural component, in particular the gradient coil,
wherein the control module of the field probe system is configured to activate the field probe system to measure the magnetic field distribution in the earlier configuration and store the response relation associated with the measured temperature in the earlier configuration and the control module of the field probe system is configured to from the memory retrieve the response relation that corresponds with the measured the temperature of the structural component in the current configuration.

7. A method of correction for resultant magnetic fields in an magnetic resonance examination system by a field probe system comprising:
by a plurality of field probes measure a magnetic field distribution of the main magnetic field and/or the gradient magnetic field in the examination zone (i) due to a switching operation of the gradient system and/or (ii) due to a magnetic field disturbance originating externally,
by a control module
control the field probe system and configured to activate the field probe system to measure the magnetic field distribution in the earlier configuration simultaneously with the acquisition of the magnetic imaging resonance signals in the earlier configuration and
determine a response relation representing the measured magnetic field distribution in the earlier configuration and i) due to said switching operation of the gradient system and/or (ii) due to said magnetic field disturbance originating externally in a memory store response relation in association with the switching operation and/or the external magnetic field disturbance in the earlier configuration and
(a) the magnetic resonance examination system's gradient system to apply the response relation from the memory to the gradient system and to compensate activation the gradient coils in a current configuration on the basis of the earlier measured response field distribution and/or
(b) the magnetic resonance examination system's reconstruction module to apply response relation from the memory to the reconstruction module which is configured to apply corrections on the basis of the earlier measured response field in the reconstruction of the magnetic resonance image from the magnetic resonance imaging signals acquired in the current configuration.

8. The method of correction for resultant magnetic fields of claim 7, wherein
successive measurements of the magnetic field distribution are made successively in various earlier configurations, simultaneously with acquiring magnetic resonance imaging signals from a patient to be examined, and as a function of (i) the switching operation of the gradient system and/or (ii) the magnetic field disturbance originating externally,
response relations are determined representing the measured magnetic field distributions for the various earlier configurations
the determined response relations are stored in dependence of (i) said switching operations and/or (ii) said magnetic field disturbances in the memory.

9. A non-transitory computer readable medium including instructions configured to control a field probe system comprising:
a plurality of field probes simultaneously with the acquisition of the magnetic resonance imaging signals at an earlier configuration measure a magnetic field distribution of the of the main magnetic field and/or the gradient magnetic field in the examination zone (i) due to a switching operation of the gradient system and/or (ii) due to a magnetic field disturbance originating externally,
by a control module
control the field probe system and configured to activate the field probe system to measure the magnetic field distribution in the earlier configuration simultaneously with the acquisition of the magnetic imaging resonance signals in the earlier configuration and
determine a response relation representing the measured magnetic field distribution in the earlier configuration and i) due to said switching operation of the gradient system and/or (ii) due to said magnetic field disturbance originating externally
in a memory store response relation in association with the switching operation and/or the external magnetic field disturbance in the earlier configuration and
(a) the magnetic resonance examination system's gradient system to apply the response relation from the memory to the gradient system and to compensate activation the gradient coils in a current configuration on the basis of the earlier measured response field distribution and/or
(b) the magnetic resonance examination system's reconstruction module to apply response relation from the memory to the reconstruction module which is configured to apply corrections on the basis of the earlier measured response field in the reconstruction of the magnetic resonance image from the magnetic resonance imaging signals acquired in the current configuration.

10. The non-transitory computer readable medium of claim 9, wherein successive measurements of the magnetic field distribution are made in various earlier configurations, simultaneously with acquiring magnetic resonance imaging signals from a patient to be examined, and as a function of (i) the switching operation of the gradient system and/or (ii) the magnetic field disturbance originating externally, response relations are determined representing the measured magnetic field distributions for the various earlier configurations the determined response relations are stored in dependence of (i) said switching operations and/or (ii) said magnetic field disturbances in the memory.

* * * * *